(12) United States Patent
Janta et al.

(10) Patent No.: US 10,046,893 B2
(45) Date of Patent: Aug. 14, 2018

(54) PATTENRED FILM FOR FORMING FLUID-FILLED BLISTER, MICROFLUIDIC BLISTER, AND KIT AND METHOD OF FORMING

(71) Applicant: NATIONAL RESEARCH COUNCIL OF CANADA, Ottawa (CA)

(72) Inventors: Mojra Janta, Verdun (CA); Xuyen Dai Hoa, Montreal (CA); Matthias Geissler, Boucherville (CA); Teodor Veres, Montreal (CA)

(73) Assignee: National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 15/484,812

(22) Filed: Apr. 11, 2017

(65) Prior Publication Data

US 2017/0291747 A1    Oct. 12, 2017

Related U.S. Application Data

(60) Provisional application No. 62/320,677, filed on Apr. 11, 2016.

(51) Int. Cl.
*B65D 73/00* (2006.01)
*B65D 65/40* (2006.01)
(Continued)

(52) U.S. Cl.
CPC ........ *B65D 65/406* (2013.01); *B01L 3/50273* (2013.01); *B65B 9/023* (2013.01);
(Continued)

(58) Field of Classification Search
USPC .... 206/528, 531, 532, 461, 469, 484, 524.1, 206/524.6
See application file for complete search history.

(56) References Cited

U.S. PATENT DOCUMENTS 3,074,544 A     1/1963   Bollmeier et al.
4,921,137 A *   5/1990   Heijenga ............ B65D 75/5811
                                                  222/107
(Continued)

FOREIGN PATENT DOCUMENTS

GB      2530596 A      3/2016
WO      2008043046     4/2008
(Continued)

OTHER PUBLICATIONS

Extended European Search Report on Application No. 17165971.7 dated Dec. 14, 2017.
(Continued)

*Primary Examiner* — Jacob K Ackun
(74) *Attorney, Agent, or Firm* — Jason E. J. Davis

(57) ABSTRACT

A patterned thermoplastic elastomer (TPE) film for fabricating a liquid-filled blister, has a blister-sized cavity in fluid communication with a microfluidic channel via a gating region. The gating region is defined by a relief pattern that has at least one of the following: at least 5 separate compartments defined by respective recesses in the first side, each of the recesses bounded by walls that separate the compartments from each other, the recess, or the channel; at least 5 walls defined by the patterning of the first side, the walls separating a plurality of compartments from each other, the recess, or the channel, wherein the walls have a mean thickness that is less than a mean height, and each pair of walls has a mean separation greater than twice the mean thickness; an array of separate compartments bounded by walls defined by the patterning of the first side that collectively define a polygonal regular planar tiling with at least 50% of the surface area of the gating region being open spaces; and a focusing region in fluid communication with the cavity, and a seal region having at least one wall defined by patterning of the film, wherein the at least one wall
(Continued)

separates the focusing region from the seal region, and a shape of the at least one wall tapers the focusing region towards the seal region.

20 Claims, 6 Drawing Sheets

(51) Int. Cl.
    *B65B 9/02*     (2006.01)
    *B65D 75/36*     (2006.01)
    *B01L 3/00*     (2006.01)
    *B65D 75/32*     (2006.01)
    *B81C 1/00*     (2006.01)
    *B29C 65/76*     (2006.01)
    *B29C 65/00*     (2006.01)
    *B29L 31/00*     (2006.01)

(52) U.S. Cl.
    CPC ......... *B65D 75/326* (2013.01); *B65D 75/367* (2013.01); *B81C 1/00158* (2013.01); *B01L 2300/087* (2013.01); *B01L 2300/123* (2013.01); *B01L 2400/0481* (2013.01); *B01L 2400/0683* (2013.01); *B29C 65/76* (2013.01); *B29C 66/1122* (2013.01); *B29C 66/53461* (2013.01); *B29C 66/71* (2013.01); *B29C 66/7392* (2013.01); *B29C 66/929* (2013.01); *B29L 2031/756* (2013.01); *B65D 2575/3218* (2013.01); *B81B 2201/058* (2013.01); *B81B 2203/0315* (2013.01); *B81C 2203/037* (2013.01)

(56) References Cited

U.S. PATENT DOCUMENTS

| | | | |
|---|---|---|---|
| 5,290,518 A | 3/1994 | Johnson | |
| 5,826,737 A * | 10/1998 | Zakensberg | B65D 75/5811 215/47 |
| 6,688,467 B2 * | 2/2004 | Krupka | A45D 40/0087 206/469 |
| 7,325,703 B2 * | 2/2008 | Gherdan | A61J 1/035 206/219 |
| 7,445,926 B2 | 11/2008 | Mathies | |
| 8,333,510 B2 * | 12/2012 | Ackermann | B65D 75/30 206/469 |
| 9,207,239 B2 | 12/2015 | Kasdan | |
| 2002/0155010 A1 | 10/2002 | Karp | |
| 2004/0173496 A1 * | 9/2004 | Srinivasan | A61M 15/0028 206/528 |
| 2006/0183216 A1 | 8/2006 | Handique | |
| 2007/0263049 A1 | 11/2007 | Preckel | |
| 2008/0230432 A1 * | 9/2008 | Bobbett | B65D 75/327 206/531 |
| 2008/0283439 A1 * | 11/2008 | Sullivan | A61M 15/0028 206/531 |
| 2009/0165320 A1 | 7/2009 | DeSimone | |
| 2011/0143339 A1 | 6/2011 | Wisniewski | |
| 2011/0206576 A1 | 8/2011 | Woudenberg | |
| 2012/0018335 A1 * | 1/2012 | Sanchez | B65D 75/5866 206/484 |
| 2012/0199509 A1 * | 8/2012 | McKiel, Jr. | A61J 1/035 206/459.1 |
| 2013/0032235 A1 | 2/2013 | Johnstone | |
| 2013/0120893 A1 | 5/2013 | Delamarche | |
| 2013/0139899 A1 | 6/2013 | Galas | |
| 2014/0053952 A1 | 2/2014 | Genosar | |
| 2014/0069517 A1 | 3/2014 | Giridhar | |
| 2014/0352819 A1 | 12/2014 | Pugliese | |

FOREIGN PATENT DOCUMENTS

| | | |
|---|---|---|
| WO | 2012091677 | 7/2012 |
| WO | 2015044454 | 4/2015 |

OTHER PUBLICATIONS

Wasay, A. et al. "Gecko gaskets for self-sealing and high-strength reversible bonding of microfluidics". Lab on a Chip, vol. 15, No. 13, May 13, 2015, pp. 2749-2753.

Inamdar, Tejas Satish. "Manufacturing of Lab-on-a-Chip devices: Characterizing seals for on-board reagent delivery". Apr. 16, 2013, pp. 1-96.

Smith, Suzanne et al. "Blister pouches for effective reagent storage and release for low-cost point-of-care diagnostic applications". Progress in Biomedical Optics and Imaging, Spie—International Society for Optical Engineering, vol. 9705, Mar. 18, 2016, pp. 97050F1-97050F5.

Microfluidic Chipshop GmbH: "Blisters—Liquid reagent storage on lab-on-a-chip devices". Nov. 19, 2015, 2 Pages.

Sameoto, D. et al. "Materials selection and manufacturing of thermoplastic elastomer microfluidics". Proceedings Optical Diagnostics of Living Cells II, vol. 9320, Mar. 5, 2015, pp. 932001-1-932001-6.

Li N., et al., Microfluidic Chips Controlled with Elastomeric Microvalve Arrays, J Vis Exp., 2007, 8, 296.

Disch, A., et al., Low cost production of disposable microfluidics by blister packaging technology, Proc. Ann. Int. Conf. IEEE EMBS, Lyon, France, 2007, 6322-6325.

Bodén, et al., On-chip liquid storage and dispensing for lab-on-a-chip applications, J. Micromech. Microeng. 18 (2008) 075036 (7pp).

Comina, G., et al., 3D printed unibody lab-on-a-chip—Features survey and check-valves integration, Micromachines 2015, 6(4), 437-451.

Focke, M., et al., Lab-on-a-foil, microfluidics on thin and flexible films, Lab on a Chip, 2010, 10, 1365-1386.

Hitzbleck, M., & Delamarche, E., Reagents in microfluidics—an "in" and "out" challenge, Chem. Soc. Rev. 2013, 42, 8494-8516.

Hoffman, J., et al., Pre-storage of liquid reagents in glass ampoules for DNA extraction on a fully integrated lab-on-a-chip cartridge, Lab on a Chip, 2010, 10, 1480-1484.

Shallan, A. I., et al., Cost-Effective Three-Dimensional Printing of Visibly Transparent Microchips with Minutes, Anal. Chem. 86(6), 3124-3130.

van Oordt, T., et al., Miniature stick-packaging—an industrial technology for pre-storage and release of reagents in lab-on-a-chip systems, Lab on a Chip, 2013, 13, 2888-2892.

Go with the flow: lab-on-a-chip devices. (Oct. 10, 2014). [text]. Retrieved Jul. 23, 2015, from http://www.pmlive.com/pharma_news/go_with_the_flow_lab-on-a-chip_devices_605227.

* cited by examiner

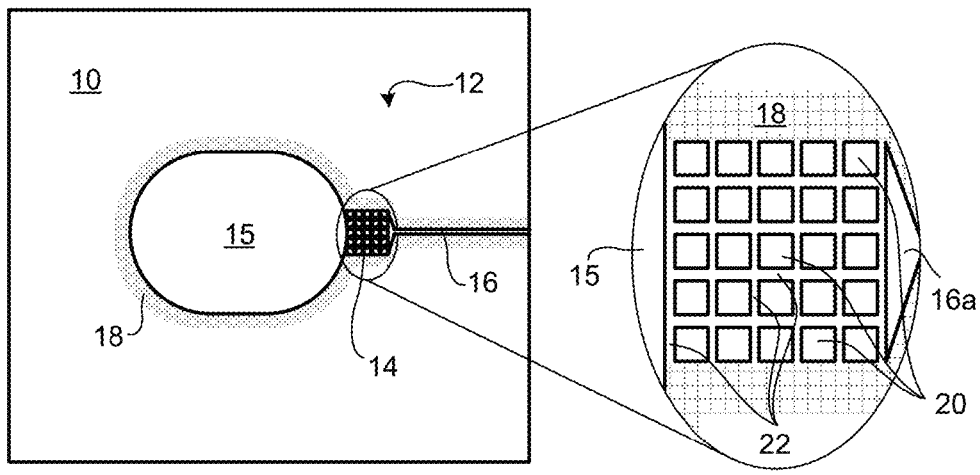
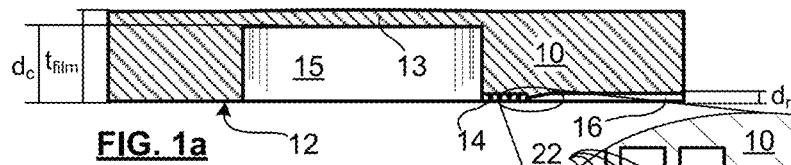
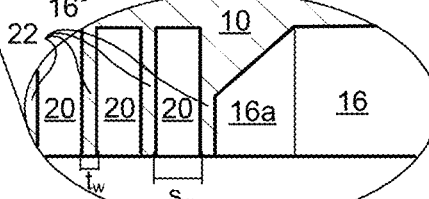
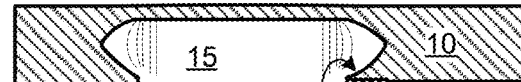
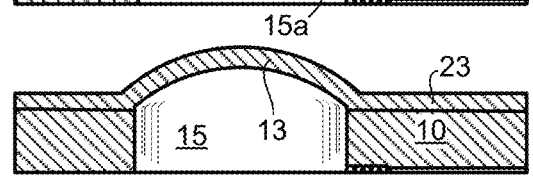
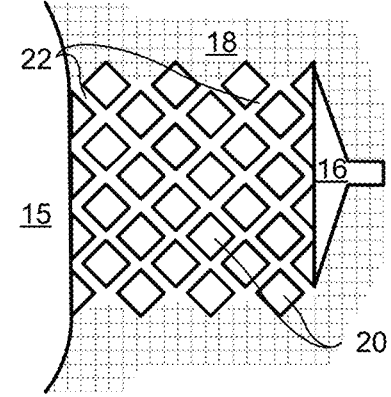
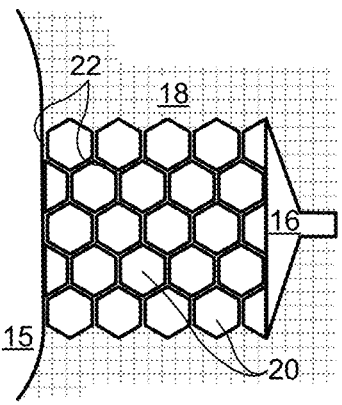
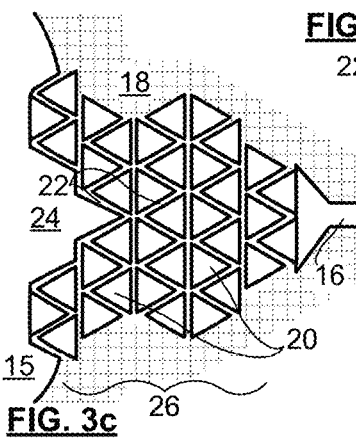
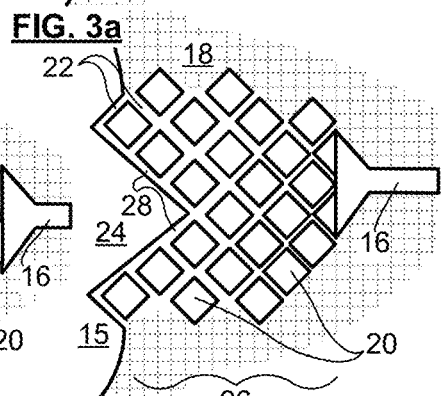

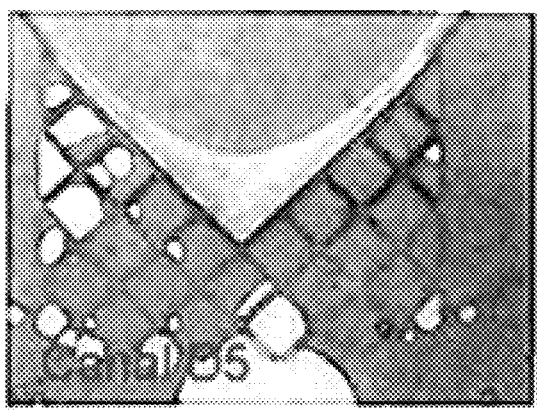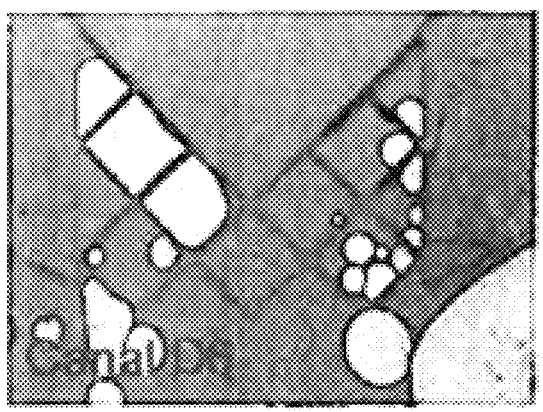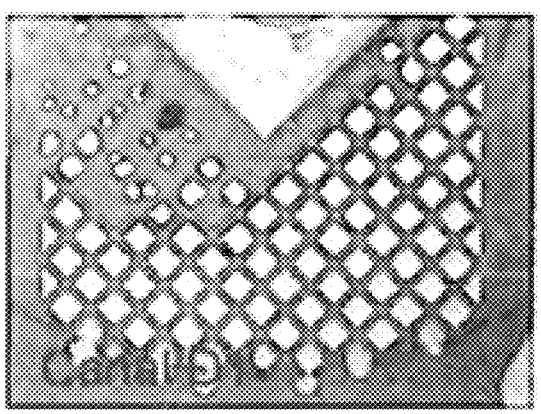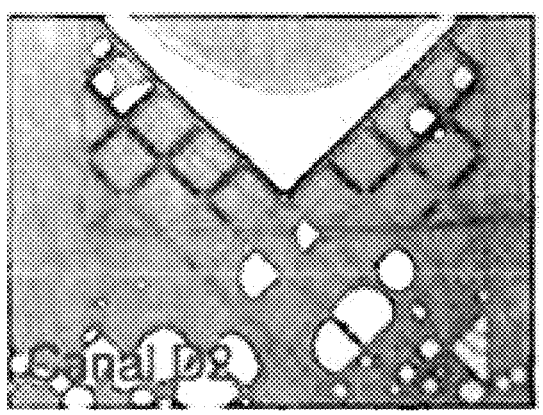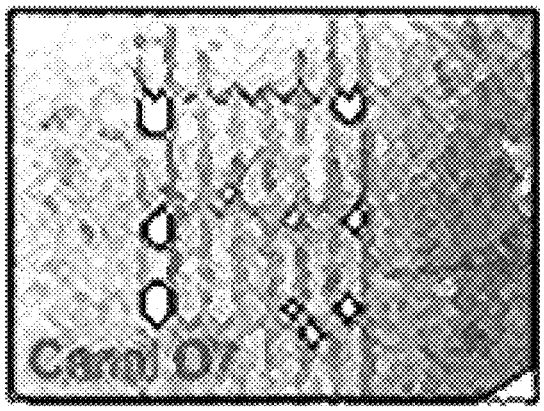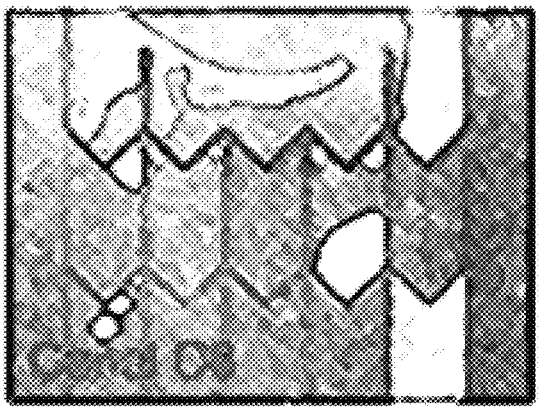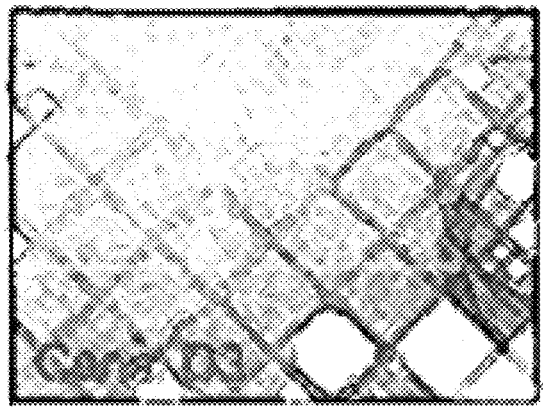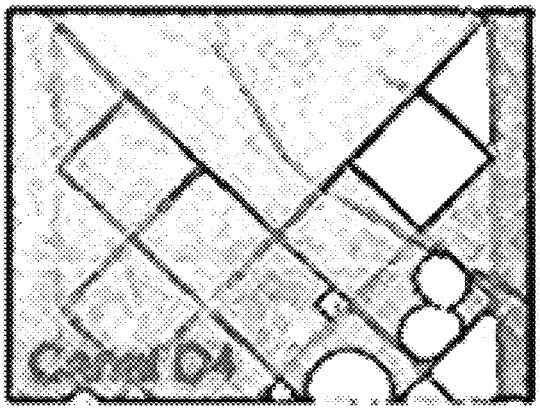
FIG. 12

PATTENRED FILM FOR FORMING FLUID-FILLED BLISTER, MICROFLUIDIC BLISTER, AND KIT AND METHOD OF FORMING

CROSS-REFERENCE TO RELATED APPLICATIONS

This application claims the benefit of United States Provisional Patent Application U.S. Ser. No. 62/320,677 filed Apr. 11, 2016.

FIELD OF THE INVENTION

The present invention relates in general to a technique for fabricating a blister containing a fluid, and seals for fluid-filled blisters, and in particular achieves an easily formed blister with improved gating for microfluidic applications.

BACKGROUND OF THE INVENTION

The term "blister", herein, signifies a closed pocket or cavity made from opposed deformable thin layers that seal the pocket or cavity. Blisters are commonly used for the packaging of consumer goods, food or pharmaceuticals where they provide protection against external factors such as moisture, UV irradiation and contamination. Most blisters are designed for solid objects, and burst across one of the two large surfaces defined by a thin layer, but a special class of blister is desired for retaining and expressing fluids. The fluid is typically a liquid, a solution, a suspension, an aqueous gel, or a fluidized particulate assembly, and typically includes at least one liquid fraction. Fluids require more control of the release during burst of the blister seal than solids, and may require tighter seals. Specifically, it is desirable to burst fluids along an interface with a microfluidic circuit that guides the fluid in a useful direction.

Blisters have attracted interest as a means of storing fluid (e.g., sample solution, buffer or reagents) on microfluidic chips, offering the prospect of performing sample analysis in a compact and inexpensive format for point-of-care (POC) diagnostics. Ejection of small volumes of fluid from the blister and its displacement within the fluidic system is anticipated to proceed through burst of the blister (e.g., as a result of applying pressure with fingertips). For example, U.S. Pat. No. 9,207,239 teaches a test cartridge for assaying infections, the cartridge having 3 microfluidic blisters that are designed to, when burst, express fluid into a chamber via a microfluidic channel.

US 2011/143,339 to Wisniewski describes a particular problem with microfluidic blisters: prior art devices that make use of temporary or frangible seals to isolate different sealed chambers may be unreliable, particularly when the regions they separate only contain low volumes (e.g., 50 microliters or less). When placing a pressure seal over a blister or channel, a capillary fluid path may remain at the interface between the pressure seal and the heat seal. Even when this capillary flow path only allows a small volume of liquid to pass, the seal is compromised. A small amount of leaked liquid may lead to the unwanted re-hydration of reagents held in adjacent sealed regions. Wisniewski's solution is to use continuously applied external pressure to form the seal. However this solution complicates design of microfluidics, requires higher parts count chips, and registration of multiple components.

It is clear that functioning of a blister requires the presence of a breakable seal that gates the blister. Herein gating is the function that allows for retention of the fluid in the blister and release of the fluid when burst. The blister should also provide an effective barrier against fluid evaporation, contamination, and reaction during storage while remaining sensitive enough to discharge the fluid when and only when a certain threshold pressure impulse is applied to the blister. Although highly desirable, especially for the dispensing of small volumes for diagnostic lab-on-a-chip technology (Hitzbleck & Delamarche, 2013), a satisfactorily functional valve has not yet been achieved. The ability to store small amounts of reagents on micro total analysis systems (µTAS) is an important step towards making "labs on chips", as opposed to "chips in labs".

Hitzbleck & Delamarche surveyed the techniques available, and concluded: two main strategies are used currently to tackle the challenge of integrating reagents into microfluidic devices: namely using a more technology-oriented approach; or a physico-chemical approach. They observe that the technological approaches favour tools that deposit reagents during fabrication of the microfluidic device or built a part of the device itself and actively dose reagents during use of the chip, and that these solutions feature high precision (amount, time and space of released reagents) but the devices are complex to manufacture and often involve bulky peripheral equipment. The physico-chemical approach is said to be dominated by beads as carriers for immobilized reagents and hydrogels as scaffolds for sustained release. Physico-chemical solutions enable the preparation and optimization of reagents offchip and in large amounts but the solutions are often specific to a reagent and its desired release profile, and must be adapted on a case by case basis. They conclude that a combination of physico-chemical and technology-oriented approaches has the potential to outperform current approaches both in terms of precision and practicability.

The most frequently used material for producing blisters, is polyvinylchloride (PVC). Other polymers include polychlorotrifluoro ethylene (PCTFE) and cyclic olefin copolymers (COC). There are two principal methods of producing blister packs: thermoforming and cold forming followed by a lamination process (often with adhesive aluminum foil). When used in microfluidic systems, fluid can be pre-incorporated into a designated storage compartment before sealing, or, fluid can be inserted into the system via loading ports after the lamination process.

Disch, Mueller, & Reinecke, 2007 and Focke et al., 2010 have used thermoforming for fabricating blisters with microfluidic components simultaneously on the same substrates. Disch, Mueller & Rienecke teach a multi-step blister made by: forming a polypropylene (PP)-COC-PP laminated film using trapped sheet vacuum thermoforming; applying a liquid into cavities of the formed PP-COC-PP film; and laminating the back of the cavities with the foil (although other plastics are suggested to be options), using an undisclosed lamination process. The lamination of the foil to the formed PP-COC-PP film is expected to be based on deformation of the Al foil as opposed to the PP-COC-PP film. As blister packs for sealing capsules break by tearing of the foil, this leaves some difficulties for releasing the liquid in a contained manner. While FIG. 7 of this reference clearly shows a blister pack with integrated microfluidics, it is far from clear how controlled valving of the liquid from the two blister chambers can be achieved. No technique is explained in the document for dispensing the liquid in one or both chambers, and in fact this would require some kind of valve, which is challenging when using known lamination processes. In order to propagate liquid from a blister cavity, the joint layers must be de-laminated along the pathway, and no access is given to this interface, except through the formed PP-COC-PP film, or the foil. If, unlike conventional blister packaging, the foil or backing material is resistant enough to avoid breakage when the blister is being opened, conventional lamination will not allow for controlled delamination of only the desired parts of the foil. Accordingly, the liquid would be expected to exit the cavity at random locations making it unavailable for an assay. Therefore, further equipment not taught or shown is required to provide for controlled release of a blister pack into a microfluidic channel.

Some closed systems are known. For example, U.S. Pat. No. 5,290,518 to Johnson proposes liquid cavities with thin side walls forming breakable barriers. The arrangement includes two thicker formed sheets sandwiching a thin sheet that is liable to tear or burst in response to pressure applied to the thicker sheets. Containment of the liquid in an opposite chamber is automatic, but some shards or remnants of the thin sheet may need to be removed from the resulting flow, and control over the bursting pressure may deteriorate over time, requiring filters and other additional structures/components. Furthermore, the release of the liquid is unconstrained in 3 dimensions according to Johnson, and the rupture mechanism is generally unpredictable.

Alternative arrangements are known that integrate a piercing element (pin or needle) to break the seal as pressure is applied (Choikhet, 2007; Handique & Kehrer, 2006). Other variants include the use of a prefilled tubular-shaped pack or pouch made from laminated composite foil (van Oordt, Barb, Smetana, Zengerle, & von Stetten, 2013) or thin pre-filled glass ampoules (Hoffmann, Mark, Lutz, Zengerle, & von Stetten, 2010) inserted into a cavity or channel of the microfluidic circuit. Once force is applied (e.g., pressure, centrifugal force), the respective foil or glass cavity is broken thereby releasing the fluid. These variants add to complexity in the design and increase cost of the device, and complexity of the fabrication.

The use of movable membranes (or plugs) to provide an opening in a fluid-containing chamber has also been reported. Under pressure the membrane (or plug) lifts thereby leaving an opening (Boden, Lehto, Margell, Hjort, & Schweitz, 2008). Here, the membrane must be separately installed or inserted into the fabricated microfluidic device which makes it impractical for low-cost, single-use devices.

Applicant's co-pending patent application Pub. No.: US 2013/0139899 entitled SEMIPERMANENTLY CLOSED MICROFLUIDIC VALVE teaches the formation of a semi-permanently closed valve in a microfluidic device by providing a patterned thermoplastic elastomer (TPE) that makes a conformal and intimate contact with a hard, smooth surface, and pressing channels closed with nominal pressure and heat, to result in a seal that requires no continuous pressure to retain. At para. [0061], this co-pending patent application addresses the issue of gating as follows: "There are competing requirements for the material deformation and bonding properties that have to be in balance in order to permit the valve to reopen reliably and easily, while ensuring that the bonding is stable until thermomechanical stimulus is encountered."

It is desirable to maintain better flow control during release of a fluid without complicating fabrication of a blister. The present invention provides a technique for improving the reliability of the gating operation, while avoiding additional material layers and components of the microfluidic chip.

SUMMARY OF THE INVENTION

Applicant has discovered a surprisingly low cost and efficient technique for providing blister seals: a technique that allows for more control over the bursting of the blister and better sealing. While in general, there is a tradeoff between ease of bursting and seal quality, Applicant breaks this stalemate with the observation that even if bonding strength is generally proportional to contact surface area, a higher number of smaller surface area walls form better seals than an equal surface area with fewer walls. A lower risk of accidental failure is associated with the duration of the pressure required to effectively burst a large number of low pressure seals, than a higher pressure seal burst in a short duration. Having a large number of seals with many walls also makes any single wall a less critical feature of the system, and allows for lower fabrication tolerances to ensure full functionality. If the walls have a mean thickness less than a mean height, and each pair of walls has a mean separation greater than the mean thickness, space is available for deformation of the wall under pressure to facilitate controlled release of the blister with minimal wall to wall interaction. It is well within the ordinary skill in this art to produce high-quality molds at reasonable cost (e.g., made from SU-8 resist on a silicon wafer) that have an array of walls (and, dually, compartments enclosed by the walls). Typically such can be produced by a polygonal regular planar tiling, such as a regular triangular, square, rectangular, hexagonal or octagonal tiling. By a regular planar tiling, Applicant herein intends a tiling where each tile is a same shape under solid transformation. The tiling may further be regular in that each edge of a polygonal tile is a same length, as this ensures a same probability of rupture along each edge. Regular tilings may have very repeatable properties, and a good trade-off between a low enough contact surface area with the substrate, with a low probability that the compartment will be crushed (a high level of support for the compartments), and therefore a predictable ability to debond. It will be appreciated that 'regularity' as used herein, like all other terms representing geometrical idealizations, are presented to represent an idea and that any reasonable approximation to the idealization is intended. Finally, Applicant has found that by providing a focusing region and a seal region in a gating region of the blister, the focusing and seal regions being divided by at least one wall, wherein the at least one wall is shaped to taper the focusing region toward the seal region, pressure in the blister can be focused onto a small subset of the compartments and further improve control of release during burst.

Accordingly, a patterned film is provided for fabricating a liquid-filled blister, the film composed of TPE. The film has opposite first and second sides, the first side defining a blister-sized cavity in fluid communication with a microfluidic channel via a gating region. At least the channel and gating region are defined by a relief pattern. The cavity and microfluidic channel are surrounded by a single continuous edge for bonding to a backing substrate to seal around the cavity. The gating region has at least one of the following: at least 5 separate compartments defined by respective recesses in the first side, each of the recesses bounded by walls that separate the compartments from each other, the recess, or the channel; at least 5 walls defined by the patterning of the first side, the walls separating a plurality of compartments from each other, the recess, or the channel, wherein the walls have a mean thickness that is less than a mean height, and each pair of walls has a mean separation greater than twice the mean thickness; an array of separate compartments bounded by walls defined by the patterning of the first side that collectively define a polygonal regular planar tiling with at least 50% of the surface area of the gating region being open spaces; and a focusing region in fluid communication with the cavity, and a seal region having at least one wall defined by patterning of the film, wherein the at least one wall separates the focusing region from the seal region, and a shape of the at least one wall tapers the focusing region towards the seal region.

The TPE may be composed of a styrene-ethylene/butylene-styrene (SEBS) polymer with less than 10 wt. % oil.

The film may further comprise a layer bonded to the second side of the film to overlie at least the cavity and forming a membrane that communicates pressure to the cavity. The layer may complete an enclosure of the cavity. The layer may cover the film. The layer may be contoured such that adhesion of the film to the contoured layer provides a shaping to the film that produces the blister-sized cavity. The relief pattern defining the gating region may be indistinguishable from a patterning on a portion of the film adhered to the contoured layer that is inside the cavity.

The film may be provided in a kit. The kit may further include the backing substrate. The backing substrate may have a meeting surface for bonding with at least the edge to define a blister, and for sealing the blister from the channel by bonding the walls or the at least one wall to the substrate. The backing substrate may be smooth and flexible. The backing substrate may be composed of a material sufficiently compatible with the TPE of the film to provide a bond that survives a bending of the bonded structure to any radius greater than 10 cm. The backing substrate may be planar and have a microfluidic pattern and an alignment mark for aligning the microfluidic pattern of the backing substrate with one of: the microfluidic channel, and a microfluidic circuit in fluid communication with the microfluidic channel. The backing substrate may be composed of a hard thermoset or thermoplastic polymer having surface properties for reversibly bonding with the film to form a water-tight seal with a pressure under 120 kPa, a temperature less than 100° C., and a time less than 1 minute. The backing substrate may be harder and stiffer than the film. The backing substrate may have a surface that covers 80-120% of the first side. The kit may further include instructions for: putting a liquid sample into the cavity; bonding the film to the substrate to seal the edge and the substrate; sealing the blister from the channel by bonding the walls, or the at least one wall, to the substrate, wherein at least one of the sheet and substrate are soft enough to facilitate manual burst of the blister. The kit may further include a sheet, and the instructions may further include steps for covering the second side of the film with the sheet.

A method for fabricating a blister is also provided. The method comprises: providing the film according to claim 1; and dispensing a fluid into the cavity and bonding the film to a substrate to seal the recess between the edge and the substrate to seal the blister by bonding a layer to the film. The fluid may be dispensed prior to bonding the film to the substrate. The method may further comprise adding a layer to cover the film on a side opposite to the substrate.

A fluid filled blister is also provided. The blister comprises: a patterned TPE film with patterned surface, the pattern of which defining a blister-sized cavity in fluid communication with a microfluidic channel via a gating region; a backing surface reversibly bonded to the film over the patterned surface wherein the cavity and microfluidic channel are surrounded by a single continuous bonded edge to seal around the cavity, the gating region and the channel; and a fluid retained within the cavity; wherein the gating region includes 5 separate compartments defined by respective recesses in the first side, each of the recesses bounded by walls that separate the compartments from each other, the recess, or the channel, and each wall has a mean thickness that is less than a mean height, and each pair of walls has a mean separation greater than twice the mean thicknesses.

The gating region may comprise an array of the separate compartments that define a polygonal regular planar tiling. At least 50% of the surface area of the gating region may be open space. The gating region may be tapered to narrow towards the channel. The blister may further comprise a layer that overlies at least the cavity.

Further features of the invention will be described or will become apparent in the course of the following detailed description.

BRIEF DESCRIPTION OF THE DRAWINGS

In order that the invention may be more clearly understood, embodiments thereof will now be described in detail by way of example, with reference to the accompanying drawings, in which:

FIGS. 1a,b are schematic elevation and plan views of a film for forming a blister in accordance with an embodiment of the present invention, each showing a respective enlargement of a gating region of the film;

FIGS. 2a,b,c schematically illustrate variations of the film of FIGS. 1a,b, in which, respectively: a side wall of the cavity is recessed; the cavity is enlarged by a bubble-shaped top formed sheet of the film; and an asymmetric shape is given to the cavity;

FIGS. 3a,b,c,d schematically illustrate plan views of variations of the patterning in the gating region in which, respectively: square chambers are rotated 45° to present diamond-shaped chambers; hexagonal chamber are used; triangular patterns are used, and the gating region tapers; and diamond-shaped chambers are used, and a spacing of the chambers decreases as the grating region tapers;

FIGS. 11 and 12 are panels showing a variety of gating region patterns that were tested in both unfilled and partially burst conditions.

DESCRIPTION OF PREFERRED EMBODIMENTS

Figure 4A:
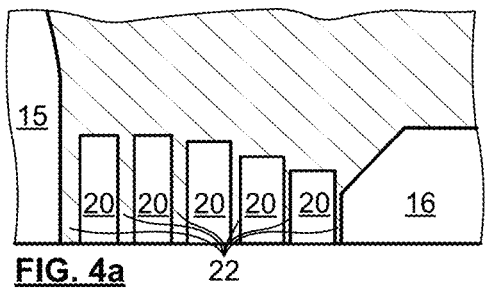
FIGS. 4a,b are schematic illustrations of elevation views of variations in the patterning in the gating region, in which, respectively: a decrease in depth of the chambers are shown; and a walls of the chambers have tapered profiles.

Herein a technique is described for sealing fluid blisters of the type that are designed to burst in a controlled way between two films that remain intact throughout the release of the fluid.

FIGS. 1a,b are schematic plan and sectional illustrations of a patterned film 10 with a relief pattern on a surface 12 thereof. The film 10 is composed of a TPE that may derive from any of the following six classes of TPE: styrenic block copolymers, thermoplastic olefins, elastomeric alloys, thermoplastic polyurethanes, thermoplastic copolyesters, and thermoplastic polyamides. The relief pattern defines a blister-sized cavity 15 having a gating region 14 intended for sealing off between the cavity 15 and a microfluidic channel 16. A single continuous edge 18 (FIG. 1b) surrounds the cavity 15, gating region 14, and the channel 16 to provide a seal around these, when well met by a suitable surface.

As is conventional, the film 10 may have a thickness $t_{film}$ of 50 μm to 50 mm, and more preferably from 0.15-30 mm, and the relief pattern may be 0.1-500 μm deep ($d_r$) across the surface 12 away from the cavity 15, and may define an array of microfluidic channels, chambers, and ports. The depth of the relief pattern in the vicinity of the cavity 15 ($d_c$) may be 1.5 times, 3 times, 5 times, 10 times, 100 times, or 1000 times $d_r$. For illustration purposes $d_c$ is shown to be about 20 times $d_r$. The microfluidic relief pattern (i.e. the relief pattern away from the cavity 15 with depth $d_r$) is preferably thinner than $t_{film}$ so that a complete enclosure of a microfluidic circuit is provided by bonding the surface 12 to the substrate. However $d_c$ need not be less than $t_{film}$, as the cavity 15 may be bounded by an additional part bonded to the film 10.

As shown in FIGS. 1a,b, a membrane 13 has a thickness of the cavity 15 is defined by $t_{film}$-$d_c$, is controlled to ensure that the membrane does not fail prior to, or during, bursting, and being sufficiently ductile. An additional layer may be used to improve fail resistance, or to reduce permeation of gasses or liquids through the film 10, as is described herein below.

The blister-sized cavity 15 is large enough so that pressure on the cavity is efficiently communicated to a fluid-filled blister formed with the film 10 as opposed to being absorbed by the structure surrounding the cavity; is preferably larger than 1 cm² so that the fluid-filled blister is easily found and selectively pressurized without accurate alignment means; and is preferably 0.1-20 cm² for convenient pressurization by an average sized finger.

The gating region 14 is shown enlarged in inset views of both FIGS. 1a,b. The gating region 14 consists of a plurality of compartments 20 in a regular array, each compartment 20 separated from each other, the recess or the channel, by walls 22 composed of the TPE film's material. For simplicity of illustration, only 3 compartments 20 and 3 walls 22 are identified by reference numeral in FIG. 1b. Herein all instances of a like feature are only identified by a like reference numeral when visually convenient. At least 5 walls 22 are preferable. To improve gating, at least 5 separate compartments 20 are preferable. The walls 22 preferably have a mean thickness $t_w$ less than a mean height (which, in the illustrated embodiment, equals $d_r$). A mean separation of the walls ($s_w$) is preferably greater than twice $t_w$. The geometrical arrangement of the compartments 20 may not make a tidy calculation of the mean separation of the walls as the embodiment of FIG. 1a,b allows, but a mean separation can be computed nonetheless. Here $s_w$ is constant, as are $t_w$ and $h_w$ (=$d_r$). By ensuring a small enough $t_w$ relative to $h_w$, the deformability of the wall is facilitated. By ensuring a small enough $t_w$ relative to $s_w$, the deforming wall has space to move into, that should be sufficient to ensure liftoff of the base of the wall; and the surface area available for contact between the TPE film 10 and the substrate in the gating region 14 is decreased.

The gating region 14 is a connected region bounded by the edge 18, cavity 15, and channel 16. The gating region 14 includes an array of the compartments 20 that are defined by a regular polygonal planar tiling, in the illustrated example, with square tiles. At least 50% of the surface area of the gating region, in plan view as in FIG. 1b, is open cavity of the compartments 20, and the bottom of walls 22, which provide for sealing, occupy less than half the surface area. It will be appreciated that any other regular polygonal planar tiling may be used, and that the film 10 need not be in planar form at any moment and may be rolled, for example, in storage or in use.

As a particular feature of the embodiment of FIGS. 1a,b, the channel 16 is coupled to the gating region 14 via a duct 16a that flares out to meet the increased diameter of the gating region 14 relative to the diameter of the channel 16. Duct 16a, as can be seen in the enlargement of FIG. 1a, narrows depth-wise throughout the flaring.

In an alternative embodiment, the compartments 20 are elongated chambers running transverse to a direction of flow during burst, which extends from the cavity 15 to the channel 16. Bursting then happens in series as a sequential failure of each complete (channel-wide) seal that separates the elongated chambers. An example of such a structure is produced by breaking at least some of the walls that extend parallel to the flow direction (and possibly a smaller number of the flow normal walls) to interconnect the compartments to provide at least 5 such elongated chambers. This reduces a number of walls 22 patterned in the film 10, ceteris paribus.

An advantage to compartmentalization of the gating region in both the flow and transverse directions is robustness of the gating. If there is any flaw in the patterning that leads to a weakened or failed attachment of the walls to a substrate in the gating region 14, it likely is a localized defect of the pattern forming. By compartmentalizing the gating region 14 in both the transverse direction and the direction of flow, localized defects have minimal effect on the gating as they will, in effect, only join a few of the compartments, while the number of compartments remains high. Furthermore a more regular surface 12 is available to meet with, and bond to, a substrate, which further improves a regularity of the bond.

In the illustrated example of FIG. 1a,b, the compartmentalization is symmetric, with equal thickness walls 22 in both the transverse and flow directions, although this can certainly be otherwise. For example, a thickness of the walls in the transverse and flow directions may be different. The walls normal to the flow may be thicker to provide better gating resistance, for example, or the walls parallel to the flow may be thicker to reduce a chance of the compartments being collapsed once a desired gating resistance is met. Alternatively, a thinnest wall that can be formed with a high enough reliability with a low enough cost process, and a largest separation $s_w$ that prevents a risk of collapse of the compartment, is preferred in some embodiments as a lowest cost, highest reliability gate region pattern.

FIGS. 2a,b,c schematically illustrate profiles (cross-sectional views) of variations of the embodiment of FIGS. 1a,b. Like reference numerals identify similar features, and their descriptions are not repeated herein. The cavity 15 as shown in all of the embodiments happens to be defined by a single sidewall. The sidewall is shown in FIG. 1b to trace a rounded rectangular shape, that is similar in size and shape to a pad of a finger/thumb. Whether there is a single sidewall, or a plurality of sidewalls that meet at edges, a profile of the sidewall and/or membrane may be provided to reduce a resistance offered by the film 10 to the depression of the membrane. This can also allow for greater evacuation of the blister once burst, and can allow for greater control over the volume dispensed. The alternative features in variations of the illustrated embodiments described herein, are not mutually exclusive: rather all combinations and permutations of these features are understood to be embodiments of the present invention.

FIG. 2a shows a sidewall with a recessed profile 15a that reduces compression of the TPE material around a periphery of the cavity 15. The specific profile 15a provides a symmetric recess that extends away from the cavity 15, with a maximum extent of the recess near a middle of the film 10. As such, this profile is well suited for forming a blister with a substrate that deforms equally via the membrane of the film 10 as by the bottom through a substrate. Given that retention of gasses may be desired for the blister, and a desire for low parts counts, it may be preferable to use a same substrate below and above the film 10.

It will be noted that forming negative pitch walls can be challenging, even with relatively soft TPEs, in that demolding can be liable to tearing or deformation. This can be solved by joining two layers of TPEs that are both patterned to provide top and bottom halves of the film. The two patterned TPE films can be joined along the maximum extent of the profile. If so, the gating region 14, channel 16, and any other microfluidic features may be provided on either side of either of the two TPE films, as long as fluid communication with the cavity 15 is provided. Alternatively, open through-hole patterning of the cavity can be provided for one side with a punch prior to patterning of the joined film if required.

Where the blister is designed for actuation principally from one side, or to avoid the challenges with joining two patterned films to form film 10, and negative pitch forming of the cavity 15, the recess may have its largest extent near an opening of the blister cavity 15, such as at surface 12. As such, the blister cavity may have a substantially monotonically decreasing sidewall profile, and be easily formed in a single step, along with the microfluidic patterning, which ensures good meeting of the microfluidic channels, with the cavity 15. If the widest recess is near the surface 12, release of the blister by upward movement of a flap defined between the recess and the gating region 14 is avoided. If the flap is sufficiently thin, this arrangement appreciably alters the mechanism of bursting, requiring a different design rules for given materials.

FIG. 2b schematically illustrates two variations on the embodiment of FIGS. 1a,b: the membrane 13 is provided by a deformable material layer 23 that is separate from the film 10; and the membrane 13 is arch away from the cavity 15 as a bubble, providing substantially more volume for the blister formed therewith. The bubble shape provides less intrinsic resistance to the blister bursting, because deformation of the membrane 13 decreases volume in the cavity 15 more with less deformation of the film 10. The bond between the layer 23 and film 10 is stronger than the gating resistance to ensure that bursting occurs where required. The flexibility to choose a different membrane material (layer 23) than the TPE film 10 allows for a lower cost design with a small amount of additional manufacturing costs, especially when material properties of the film 10 are not ideal for providing the blister without a lot of material.

To arch the layer 23 only around the cavity 15, it may be preferable to bond the layer 23 as a flat sheet, placing the assembly against a counter plate that has a dimple for shaping a top edge of the layer 23, and pressing a tool into the layer through the cavity 15. If deformation of the layer 23 can be performed at sufficiently low temperature, the tool may also meter and dispense the fluid into the cavity 15, or a separate tool may perform this in tandem, or series.

Alternatively, the arching of the layer 23 may be provided by placing the assembly as before against a counterplate, where the counterplate has a hole in place of the dimple. A suction cup is used to grip and retract the membrane 13 while the fluid is dispensed into the cavity 15. Once the substrate is bonded to the film 10 across surface 12, the suction cup can be released. A sufficient amount of the deformation caused by the suction cup is plastic to ensure that the residual pressure in the chamber does not begin to initiate bursting of the blister. Still a desired amount of residual pressure may remain in the cavity 15 because of an elastic deformation of the membrane. This may discourage entry of additional fluid into the blister across permeable surfaces, or permit partial removal of gaseous components if the film 10 or membrane 13 have suitable permeabilities.

FIG. 2c schematically illustrates a third variation on the embodiment of FIGS. 1a,b. The third variation incorporates a patterned layer 23, that may be patterned prior to meeting with film 10, or afterwards. One advantage of this variation is that if: thicker TPE films 10 are expensive to pattern or handle; the material is expensive because of a requirement to provide a particular surface chemistry; or the material properties desired of the microfluidic circuit do not naturally provide good properties for the membrane 13, a thinner film 10 can be used. Such a film is still thick enough to support the relief patterns defining a microfluidic circuit, but may be far thinner than a desired blister. As the patterned layer 23 does not come into contact with the fluid in the blister or microfluidic circuit, a very large class of materials can be used, including materials that would crack or degrade during burst, as sealing is entirely provided between the substrate and the film 10.

The gating region 14 may be larger than required, so that precise alignment of the film 10 with the cavity 15 is not required, if the film 10 is formed prior to meeting the preformed patterned layer 23. Alternatively, the patterned layer 23 is bonded to an unpatterned TPE film, and then a relief mold is used to pattern the TPE film to form film 10. The relief mold preferably includes features for defining a microfluidic circuit, and the gating region 14. The features defining the gating region 14 may extend into the space defined by the cavity 15 by a wide margin, and accordingly a precise alignment of the mold with the pattern of the patterned layer 23, is not required. Thus a low-cost, low precision, forming process can be used to produce blisters, even though the gating region 14 may have features that are near a feature forming limit.

The cavity 15 may be asymmetric as shown in FIG. 2c, and may generally be designed to reduce a force pressing the gating region 14 to the substrate during the blister release, by making a center, or opposite edge of the cavity 15, more susceptible to deformation.

FIGS. 3a,b,c,d are schematic illustrations, in plan view, of various gating regions 14. Specifically the gating region 14 of FIG. 3a shows compartments 20 of a same size and shape as the embodiment of FIGS. 1a,b, but arrayed differently. The compartments 20 are oriented 45° with respect to the walls. Where the gating region 14 meets the cavity 15, or the duct 16a, the compartments 20 appear to form smaller, triangular compartments 20, but in fact these are open to the duct 16a or cavity 15, and the apparent wall is a result of a difference in depth of the gating region 14 and these two neighbouring areas.

The embodiment of FIG. 3b has compartments 20 of hexagonal boundary shape, giving the gating region 14 a honeycomb appearance. For equal lengths of walls 22 and thicknesses $t_w$, a honeycomb structure will have a higher fraction of the gating region being open space, and therefore lower resistance to bursting. Conversely, FIG. 3c has triangular compartments 20 which will have a lower fraction of open space in the gating region for the same length. Depending on the bonding properties between the surface 12 and the substrate, some variations in design are useful.

The embodiment of FIG. 3d shows a variation in wall thickness that generally grows thinner closer to the microfluidic channel 16. This provides for lower resistance after a certain amount of the gating region 14 is burst.

The embodiments of FIGS. 3c,d schematically illustrate another aspect of the present invention. The gating region 14 is formed with a focusing region 24 in fluid communication with the cavity, and a seal region 26 having a plurality of walls 22 defined by patterning of the film 10, including at least one wall 28 (12 in FIG. 3c, 8 in FIG. 3d) that separates the focusing region 24 from the seal region 26. A shape of the focusing region 24 towards the seal region 26, is defined by the at least one wall 28, and tapers or narrows toward the seal region 26. This arrangement has been found to improve the control over the bursting, in that the first at least one wall 28 to separate is that closest the channel 16. The tapered design allows for more control of microfluidic flow during bursting, and is independently inventive.

The embodiments of FIGS. 3c,d further illustrate that the seal region 26 can be tapered to meet the microfluidic channel 16.

FIG. 4a schematically illustrates a variant in which the walls 22 do not all have a same thickness $t_w$ and that the compartments 20 need not have a same depth $d_r$, or wall separation $s_w$. The embodiment shown particularly allows for less resistance to bursting after more walls 22 have been detached.

Figure 4B:
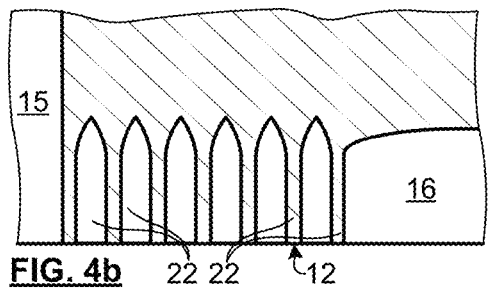

FIG. 4b schematically illustrates a variant in which the walls 22 have tapered profiles. It can be easier to form compartments that narrow further from the surface 12.

Figure 5A:
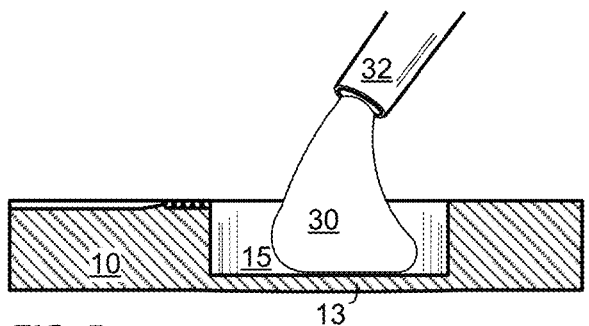
FIGS. 5a-d are schematic illustrations of steps in a method of producing a liquid filled blister using a patterned film, in accordance with the present invention.

FIGS. 5a,b,c,d schematically illustrate a method of making a liquid-filled blister using a patterned film 10. The method involves (FIG. 5a) dispensing fluid 30 into the cavity 15, via a nozzle 32 of a fluid dispensing device. The fluid 30 may be include a water phase, or an oil liquid phase, and is preferably liquid-based. The nozzle 32 may be of any convenient form, including ink-jet type dispensers, micropipettes, and manual or mechanized dispensers of the kind known in the art.

Figure 5B:
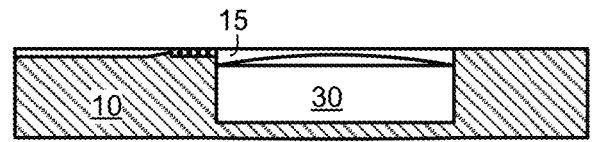

FIG. 5b schematically illustrates the chamber 15 substantially filled with the fluid 30. A meniscus of the fluid 30 is spaced from surface 12 to ensure that the fluid does not interfere with bonding of surface 12 to a substrate 35. This may be ensured by adequate metering of the volume dispensed, and/or by wiping any excess liquid from the surface 12. As described hereinabove, the membrane 13 may be retracted and pulled away from the cavity by an active force during the filling, or may be deformed to arch away from a centre of the cavity 15.

Figure 5C:
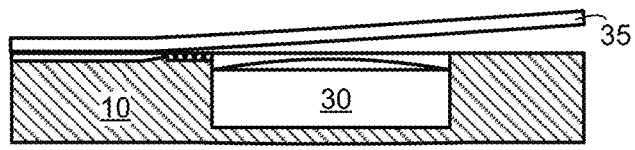

Additionally, where the fluid 30 is liable to interrupt semi-permanent bonding of the surface 12, as shown in FIG. 5c, the substrate 35, is preferably applied to the gating region 14 prior to, or at a same time as the cavity 15, and not across the cavity 15 first and then the gating region 14. Accordingly, it may be preferable, where a plurality of the blisters are provided on the film 10, to have the gating regions on a common side of their respective cavities.

The substrate 35 may be less deformable than the film 10, and deformation may be provided by pressing the bottom of the film 10 towards the substrate 35, for equal effect. For example, a roller may be used to perform this. Depending on surface affinities of the substrate 35 and surface 12, bonding may be achieved with nominal pressure (including no more than atmospheric pressure), and low temperature (including ambient). The pressure and temperature required for bonding varies with the surface area of the bond, and the nature of the materials, especially the surface properties of the TPE film. For a broad range of soft TPEs, and rigid thermoplastic polymer substrates, with a contact surface of 5-50% of a bonding region that is at least 0.01 $mm^2$, a pressure of 100-150 kPa is sufficient at 20-40° C. to give a reversible bond within less than 5 h, and frequently within 1 minute or substantially instantaneously an adequate bond is formed for resisting ambient pressure variations of a noisy environment. It will be appreciated that polymeric similarity between the TPE film and substrate tends to increase bond strength and extreme polymeric dissimilarity tends to decrease bond strength. For example, if one of the TPE and substrate is fluorinated while the other is not, a surface treatment may be called for to permit sufficient bonding, as is known in the art. Likewise if too strong a bond is provided between a TPE with hard blocks that are compatible (or identical) to the substrate composition, surface treatment prior to bonding may be used to ensure that the bond is semipermanent, and breakable without rupture of the polymer, to enable bursting.

Proof-of-concept demonstrations have been performed using Mediprene OF 400 (a transparent, medical-grade TPE elastomer) in combination with a variety of hard thermoplastic polymers such as COC, polycarbonate or poly(methyl methacrylate). Other suitable examples of TPE include Kraton™, Laprene™ and Versaflex™. Hard polymers may further be extended to poly(ethylene) (PE), PP, polyamide, polystyrene, PVC, polyester and their blends. Bonding between TPE and hard thermoplastic polymers is preferably reversible, but forms a water-tight seal. A key feature in this context is the fact that many TPEs such as SEBS materials possess both solid and liquid properties alike, making it possible to conform to another surface at the microscopic scale, while maintaining rigidity at the macroscopic level. Bonding is further re-enforced through polymer-polymer interaction by taking advantage of inter-diffusion and reorientation of polymer chains from the soft (liquid-like) blocks of the elastomer.

Adhesion varies for each material combination and a peel strength may range from 0.05 to 100 kN/m, more preferably 0.1 to more than 10 kN/m (ASTM D903). The force of adhesion can be increased by annealing at elevated temperatures (e.g., between 40 to 80° C.). Conversely, adhesion can be reduced through surface modification (that may be performed locally on one of the substrates) for polymers that bond together very strongly (e.g., Mediprene and Zeonor). This may be achieved by depositing a thin layer of a fluorinated hydrocarbon compound using a stencil mask, for example, in order to reduce surface energy of one of the layers at the region of the gate structure. Too high of an adhesion is to be avoided since the barrier will fail to open upon actuation of the blister, or require rupture of the wall. Too low of an adhesion is also to be avoided since the sealing and hence encapsulation of the liquid may be compromised in the first place. Finger-based actuation (e.g., lateral pinch using index finger and thumb) can typically generate force up to 60-100 N, which is considered in the design of the blister as well as in the combination of materials used for fabrication and their treatment after assembly. To perform comfortably, the barrier of the blister pack is preferably designed to break when applying a force of 5-55 N, 7-50 N, 10-45 N, 15-40 N, and most preferably 20-35 N.

Figure 5D:
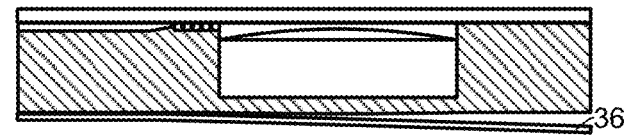

FIG. 5d schematically illustrates an optional step of applying a second layer 36, which may, 1—increase a stiffness of the blister; 2—decrease a permeability of the blister (such as to water vapour or other gasses or liquids, most notably the water-vapour transmission rate (WVTR)); 3—provide a desired material property for blister dispensing; or 4—may be suitably opaque, to protect the encapsulated fluid from light of given frequencies, if the fluid is sensitive. The second layer 36 may be of a same thickness or material composition, as substrate 35, and may be a separate instance of the same layer.

While FIGS. 5a-d schematically illustrate one method of producing a fluid filled blister in accordance with the present invention, another method allows for the bonding of the film to the substrate prior to dispensing the fluid. There are two principle advantages of this alternative method: there is a reduced risk of the fluid interfering with the bonding in the gating region; and the gating resistance of the blister can be tested prior to dispensing. Some metering and delivery techniques can permit the order of steps 5a and b, to come after 5c, and/or 5d. If the fluid has sufficient flowability for needle-type injection, and either film 10, second layer 36, or substrate 35 is a self-sealing puncturable material, the delivery of the fluid may be performed after the bonding of the film to the substrate. If the self-sealing puncturable material is second layer 36, even if the membrane 13 is not self-sealing, the dispensing is performed after step 5d. Furthermore, the embodiment of FIG. 2b can be formed by first bonding 10 to the substrate, filling of the cavity, and then the addition of second layer 23.

Figure 6A:
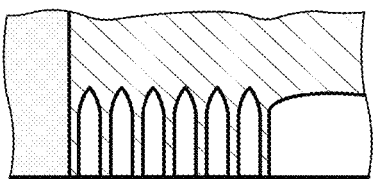
FIGS. 6a-f are schematic illustrations of steps in bursting a blister in accordance with the present invention.
Figure 6B:
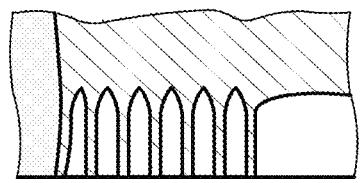
Figure 6C:
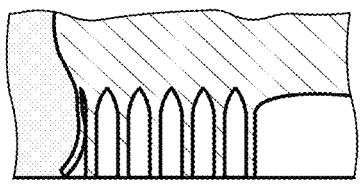
Figure 6D:
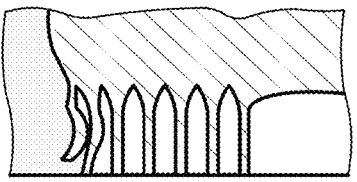
Figure 6E:
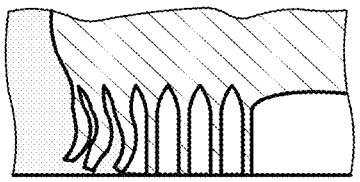
Figure 6F:
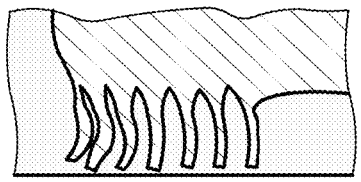

FIGS. 6a,b,c,d,e,f is a sequence of sectional views of the blister during dispensation. The substrate 35 is not illustrated. The images show the sequential rupture of 7 effective walls 22 present along a section line running through the film 10. It will be appreciated that the problem is inherently 3 dimensional and imaging is schematic. FIG. 6a schematically shows a blister in stasis, prior to a critical pressure. Once the critical pressure is reached (FIG. 6b), a first wall 22a begins to deform. The first wall 22a detaches from the substrate 35 (not in view) by FIG. 6c. By FIG. 6d, a second wall 22b is deforming, and by FIG. 6e, the second wall 22b has detached, and a third wall 22c is about to detach. By FIG. 6f, all of the walls have detached. By providing many such walls, the security of the blister is ensured against transient strikes, as a persistent pressure is required to burst the blister.

The cavities 15 shown herein are open only at the bottom surface 12, but open through-hole forming of the macroscopic cavity 15 as a separate process to the microfluidic patterning may be feasible and even preferred. For example, using a through-hole formed cavity 15, a semi-permanent bond may be made (and even tested) between bottom surface 12 and the substrate 35, prior to and dispensing of the fluid 35 into the cavity (via the open end). At this junction a sealing layer, which may be of a same or different composition or thickness, can be applied to define membrane 13 and enclose the cavity 15. In either case, the method comprises dispensing the liquid into the film, and enclosing the blister by applying at least one layer over the film.

Figure 7:
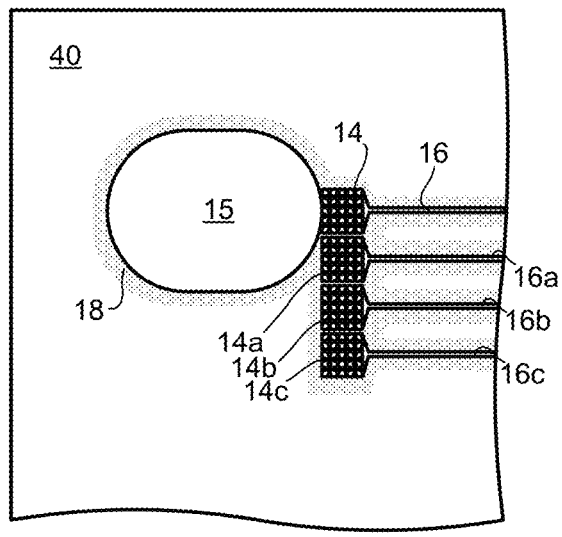
FIG. 7 is a schematic illustration of a blister for multiple, sequential, delivery to parallel circuits, in accordance with an embodiment of the invention.

FIG. 7 is a schematic plan view of a blister 40 having a plurality of microfluidic channels 16 that can only be dispensed in series. The principle difference between this blister and one achieved hereinabove, is that the gating region 14 is laterally coupled to a second gating region 14a, which is laterally coupled with a gating region 14b, etc. The edge 18 extends around each gating region, as well as around respective microfluidic channels 16, 16a,b,c of each gating region.

In operation, the blister 40 is pressed until gating region 14 is overcome. This opens fluid communication with channel 16. In one embodiment, the fluid resistance through channel 16 is sufficient to result in a back pressure through the gating region 14, to permit continuous release of gating region 14a while fluid is delivered through channel 16. In another embodiment, once fluid is delivered to an end cavity of a microfluidic circuit connected to channel 16, back pressure through channel 16 builds up, and a further pressure applied at the blister 40 will burst gating region 14a.

A specific pressure-time regimen may be used to reliably burst gating regions 14, 14a, 14b,14c in sequence, and specific hydrodynamic resistances of the channels may be provided to ensure time-based delivery of the fluid to respective microfluidic circuits.

Figure 8:
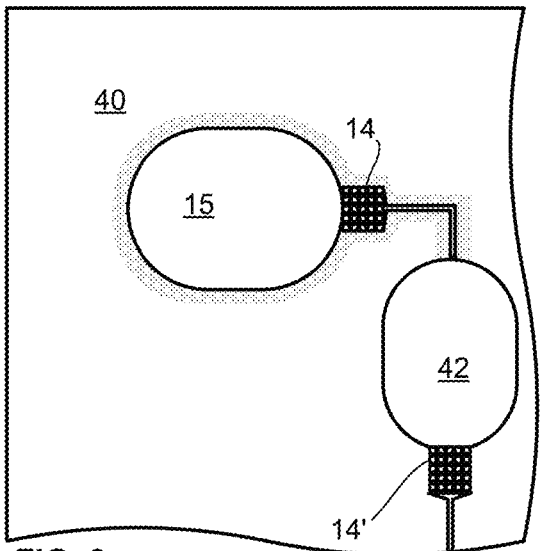
FIG. 8 is a schematic illustration of a multi-cavity blister for two phase operation: initial burst to deliver, and mix content of two chambers, and second burst to deliver the mixture to a microfluidic circuit, in accordance with an embodiment of the invention.

FIG. 8 schematically illustrates a blister 40 coupled to a reagent cavity 42 for metering a fluid of known concentration that is freshly prepared by mixing the content of the blister 40 with a content of the reagent cavity 42. While the cavity 15 contains a fluid, the reagent cavity may hold a solid or non-fluid liquid, as long as it may be dissolved, or suspended in a fluid in cavity 15, or a reactant produced by mixing the two is fluid. In operation, once the blister 40 bursts, it pushes the fluid into reagent cavity 42. Continued application of pressure encourages mixing of the fluid with the content of the reagent cavity 42. Further pressure will lead to release of a gating region 14' adjacent to the reagent cavity 42. Again a specific pressure time regimen may be used to ensure that a desired dwell time of the mixing is performed prior to release of the gating region 14', for example by requiring a higher pressure to burst gating region 14' than for bursting gating region 14.

EXAMPLES

A series of examples of the present invention have been produced with a film of TPE, specifically composed of Mediprene® (Mediprene® grade 400 OF obtained from ELASTO). The Mediprene was received in pellet form. The pellets were melted and extruded without any additives to form a plurality of films of typically 1-1.5 mm in thickness. The film was thermoformed by hot embossing in conjunction with an epoxy resin mold (CONAPDXY FR-1080; Cytec Industries) which was prepared from a photo-lithographically created SU-8 master using an intermediate replication step in poly(dimethyl siloxane) (Sylgard 184, Dow Corning). The embossing process produced in the films: cavities (circular; typically 7-10 mm in diameter), a gating region (typically 3-5 mm in width and length) with a patterning in the gating region of walls (between 20 and 600 μm in width and length) and a microfluidic channel (typically between 0.05 and 5 mm in width) simultaneously. A multi-level mold allows for adjusting the depth of each structure accordingly (e.g., 700 μm for the reservoir and 50 to 200 μm for the gating pattern and channel). The film patterning was performed by using an EVG 520 system (EV Group) at a typical temperature of 100-120° C., an applied force of 5-10 kN, and a pressure of $10^{-2}$ mbar, for 5-15 min. The film was placed with the patterned side facing up and the cavity was filled with 110 μL of coloured water using a micropipette. The hard-plastic backing substrate (typically 100 to 200 μm in thickness) was then placed by hand on the elastomer. The backing was bent slightly upwards while contact was established at one of the outer portions of the substrate. The backing's bend was then gradually relieved and contact propagated across the entire surface area including the filled cavity. The assembly process was carried out at ambient conditions (room temperature), with little pressure applied to the surfaces, so that the film was not appreciably compressed in the neighbourhood of the cavity. Backplane materials that were tested and used include Zeonor ZF14-188 (Zeon Chemicals), Aclar UltrRX 4000 (Honeywell) and polycarbonate (McMaster). All backplane materials were received in sheet format, were cut into adequate size, and protective films were removed prior to bonding.

Bonding to the Zeonor substrate was found generally sufficient without any thermal annealing. Bonding to Aclar UltrRX 4000 (Honeywell) was found not to be generally sufficient, and was improved by thermal annealing at 50-80° C. for 24 h at ambient pressure, although the duration of the annealing and peal strength were not studied, and this is not believed to be optimal. The polycarbonate samples were similarly heat treated without determining whether it was necessary.

Figure 9:
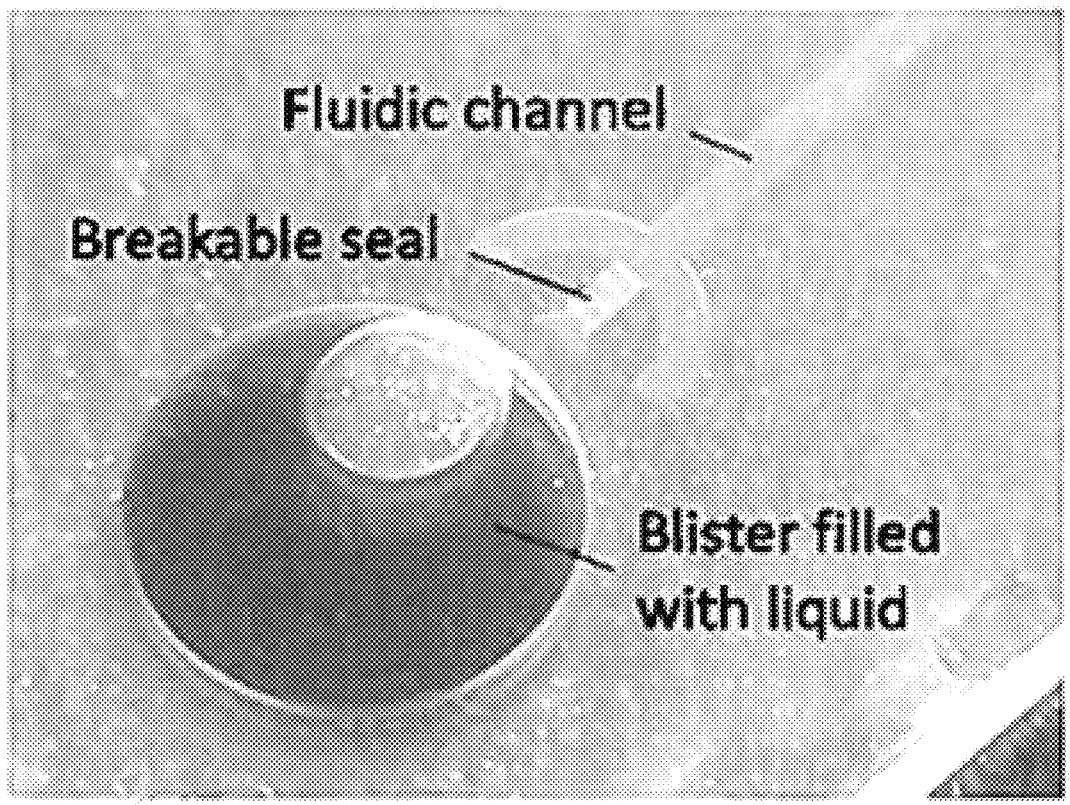
FIG. 9 is an image of a blister formed to demonstrate the present invention.

FIG. 9 is an image of a liquid-filled blister with a breakable seal defining a gating region, and a microfluidic channel. The position of an air bubble in the imaged blister may give the impression to the viewer that the chamber is domed, however the chamber shape was cylindrical.

Figure 10:
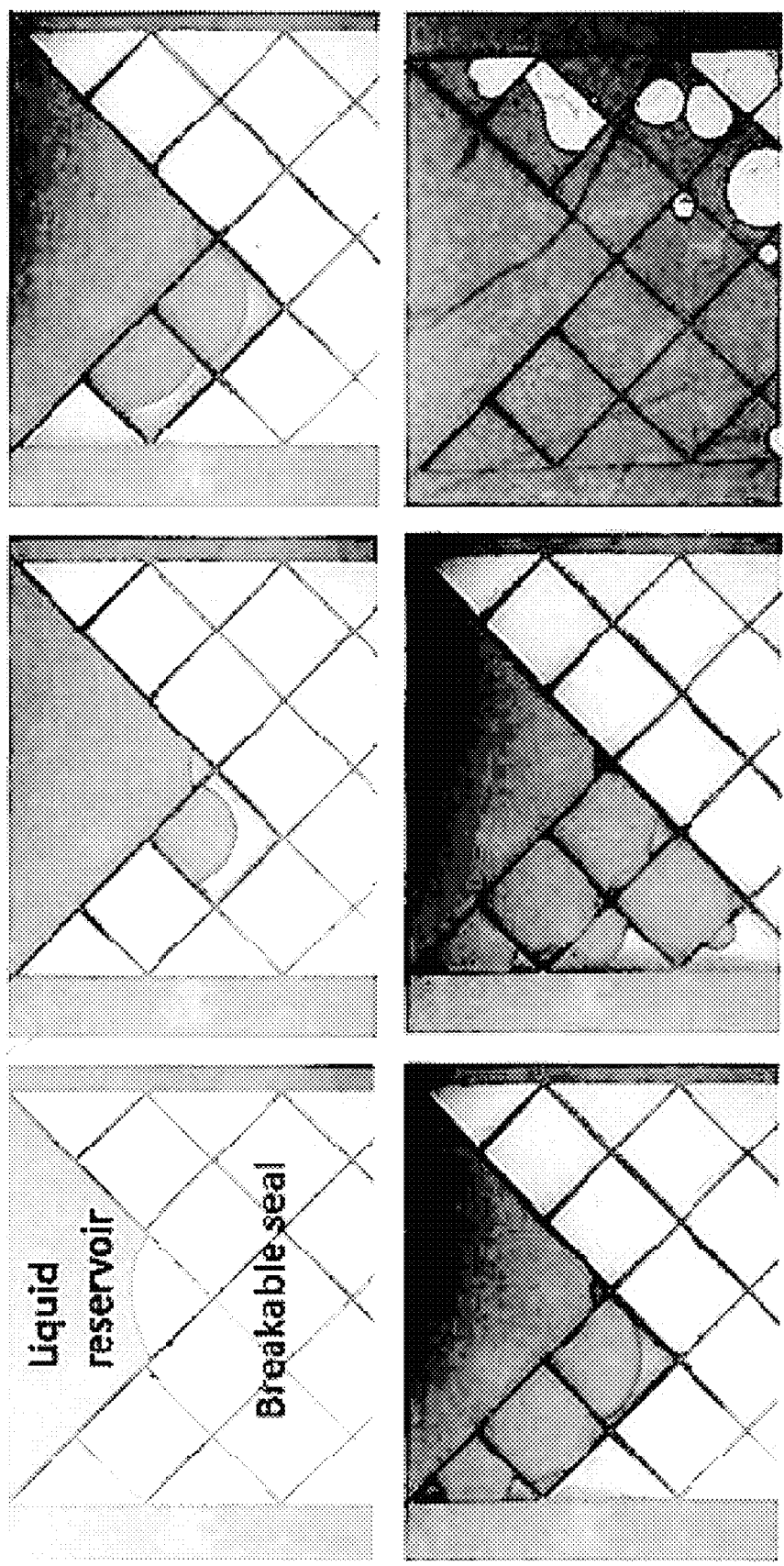
FIG. 10 is a panel of 6 sequential photographs showing bursting of the blister.

FIG. 10 shows the specific compartments and walls of the gating region which defines the breakable seal. The dimensions are 400 μm in width and length for each compartment and 20 μm in width for the walls, corresponding to a pore density of 90.7%. FIG. 10 is a panel of enlarged still frames of a video capture of the blister bursting. It shows how the blister bursts, that the first wall to give is generally at or near a point defined by a focusing region. The bursting is a more controlled release than with prior art blister designs. Darker regions are regions filled with fluid, and lighter regions are filled with air.

Figure 11:
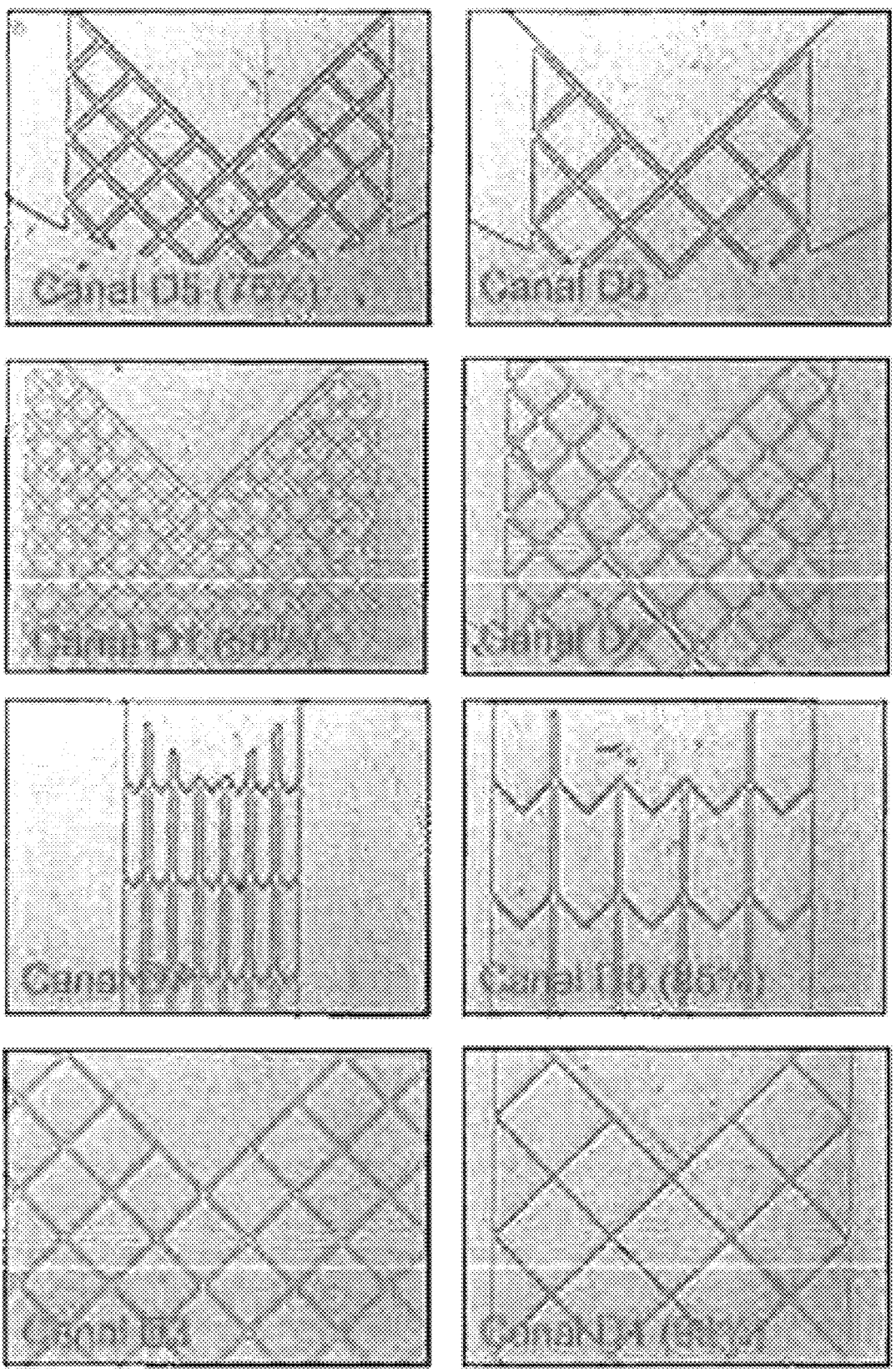

FIG. 11 is a panel of 8 examples of patterns used for forming seals. FIG. 12 is a panel showing the same 8 patterns, once the blister is released (some partially, some completely). Each of these patterns worked reliably.

Other advantages that are inherent to the structure are obvious to one skilled in the art. The embodiments are described herein illustratively and are not meant to limit the scope of the invention as claimed. Variations of the foregoing embodiments will be evident to a person of ordinary skill and are intended by the inventor to be encompassed by the following claims.

The invention claimed is:

1. A patterned thermoplastic elastomer (TPE) film for fabricating a liquid-filled blister, the film having opposite first and second sides, the first side defining a blister-sized cavity in fluid communication with a microfluidic channel via a gating region, at least the channel and gating region being defined by a relief pattern, wherein the cavity and microfluidic channel are surrounded by a single continuous edge for bonding to a backing substrate to seal around the cavity, and the gating region has at least one of the following:
   a) at least 5 separate compartments defined by respective recesses in the first side, each of the recesses bounded by walls that separate the compartments from each other, the recess, or the channel;
   b) at least 5 walls defined by the patterning of the first side, the walls separating a plurality of compartments from each other, the recess, or the channel, wherein the walls have a mean thickness that is less than a mean height, and each pair of walls has a mean separation greater than twice the mean thickness;
   c) an array of separate compartments bounded by walls defined by the patterning of the first side that collectively define a polygonal regular planar tiling with at least 50% of the surface area of the gating region being open spaces; and
   d) a focusing region in fluid communication with the cavity, and a seal region having at least one wall defined by patterning of the film, wherein the at least one wall separates the focusing region from the seal region, and a shape of the at least one wall tapers the focusing region towards the seal region.

2. The film according to claim 1 composed of a SEBS polymer with less than 10 wt. % oil.

3. The film according to claim 1 further comprising a layer bonded to the second side of the film to overlie at least the cavity and forming a membrane that communicates pressure to the cavity.

4. The film according to claim 1 wherein the layer completes an enclosure of the cavity.

5. The film according to claim 3 wherein the layer covers the film, and the layer is contoured such that adhesion of the film to the contoured layer provides a shaping to the film that produces the blister-sized cavity.

6. The film according to claim 5 wherein the relief pattern defining the gating region is indistinguishable from a patterning on a portion of the film adhered to the contoured layer that is inside the cavity 15.

7. The film according to claim 1 in a kit with the backing substrate, the substrate having a meeting surface for bonding with at least the edge to define a blister, and for sealing the blister from the channel by bonding the walls or the at least one wall to the substrate.

8. The film in a kit according to claim 7 wherein the backing substrate is smooth and flexible, and composed of a material sufficiently compatible with the TPE of the film to provide a bond that survives a bending of the bonded structure to any radius greater than 10 cm.

9. The film in a kit according to claim 7 wherein the backing substrate is planar and has a microfluidic pattern and an alignment mark for aligning the microfluidic pattern of the backing substrate with one of: the microfluidic channel, and a microfluidic circuit in fluid communication with the microfluidic channel.

10. The film in a kit according to claim 7 wherein the backing substrate is composed of a hard thermoset or thermoplastic polymer having surface properties for reversibly bonding with the film to form a water-tight seal with a pressure under 120 kPa, a temperature less than 100° C., and a time less than 1 minute.

11. The film in a kit according to claim 7 wherein the backing substrate is harder and stiffer than the film, and has a surface that covers 80-120% of the first side.

12. The film in a kit according to claim 11 further comprising a sheet and instructions for:
   putting a liquid sample into the cavity; bonding the film to the substrate to seal the edge and the substrate; sealing the blister from the channel by bonding the walls, or the at least one wall, to the substrate; and covering the second side of the film with the sheet, wherein at least one of the sheet and substrate are soft enough to facilitate manual burst of the blister.

13. A method for fabricating a blister, the method comprising:
provide the film according to claim 1; and
dispensing a fluid into the cavity and bonding the film to a substrate to seal the recess between the edge and the substrate to seal the blister by bonding a layer to the film.

14. The method of claim 13 wherein the fluid is dispensed prior to bonding the film to the substrate.

15. The method of claim 14 further comprising adding a layer to cover the film on a side opposite to the substrate.

16. A fluid filled blister comprising:
a patterned thermoplastic elastomer (TPE) film with patterned surface, the pattern of which defining a blister-sized cavity in fluid communication with a microfluidic channel via a gating region;
a backing surface reversibly bonded to the film over the patterned surface wherein the cavity and microfluidic channel are surrounded by a single continuous bonded edge to seal around the cavity, the gating region and the channel; and
a fluid retained within the cavity;
wherein the gating region includes 5 separate compartments defined by respective recesses in the first side, each of the recesses bounded by walls that separate the compartments from each other, the recess, or the channel, and each wall has a mean thickness that is less than a mean height, and each pair of walls has a mean separation greater than twice the mean thicknesses.

17. The liquid filled blister according to claim 16 wherein the gating region comprises an array of the separate compartments that define a polygonal regular planar tiling.

18. The liquid filled blister according to claim 16 wherein at least 50% of the surface area of the gating region is open space.

19. The liquid filled blister according to claim 16 wherein the gating region is tapered to narrow towards the channel.

20. The liquid filled blister according to claim 16 further comprising a layer that overlies at least the cavity.

* * * * *

UNITED STATES PATENT AND TRADEMARK OFFICE
CERTIFICATE OF CORRECTION

PATENT NO. : 10,046,893 B2  
APPLICATION NO. : 15/484812  
DATED : August 14, 2018  
INVENTOR(S) : Mojra Janta et al.

Page 1 of 1

It is certified that error appears in the above-identified patent and that said Letters Patent is hereby corrected as shown below:

On the Title Page

Item (54) and in the Specification, Column 1, Line 1, should read as follows:
Patterned Film for Forming Fluid-Filled Blister, Microfluidic Blister, and Kit and Method of Forming Signed and Sealed this  
Fifteenth Day of January, 2019

Andrei Iancu  
*Director of the United States Patent and Trademark Office*